US012654258B2

(12) United States Patent
Ikku et al.

(10) Patent No.: US 12,654,258 B2
(45) Date of Patent: Jun. 16, 2026

(54) ELECTRODE WELDING METHOD AND ELECTRODE WELDING APPARATUS

(71) Applicant: DISCO CORPORATION, Tokyo (JP)

(72) Inventors: Yuki Ikku, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 988 days.

(21) Appl. No.: 17/648,329

(22) Filed: Jan. 19, 2022

(65) Prior Publication Data

US 2022/0226934 A1     Jul. 21, 2022

(30) Foreign Application Priority Data

Jan. 21, 2021     (JP) ................................. 2021-007890

(51) Int. Cl.
| | |
|---|---|
| *B23K 26/50* | (2014.01) |
| *B23K 26/22* | (2006.01) |
| *H10W 72/00* | (2026.01) |

(52) U.S. Cl.
CPC ....... *B23K 26/50* (2015.10); *H10W 72/07141* (2026.01)

(58) Field of Classification Search
CPC ........ B23K 26/00; B23K 26/22; B23K 26/50; B23K 26/0823; B23K 26/0853; H01L 24/75; H01L 2224/81224
See application file for complete search history.

(56) References Cited

U.S. PATENT DOCUMENTS

| | | | | |
|---|---|---|---|---|
| 7,222,772 B2 * | 5/2007 | Arai | ........................ | H01L 24/78 228/264 |
| 2009/0090468 A1 * | 4/2009 | Murayama | ........... | B23K 1/0056 156/350 |

| | | | | |
|---|---|---|---|---|
| 2016/0089755 A1 * | 3/2016 | Kogushi | .................. | B25J 9/023 29/430 |
| 2017/0197277 A1 * | 7/2017 | Hirata | .................. | B28D 5/0011 |
| 2017/0291255 A1 * | 10/2017 | Hirata | ..................... | C30B 33/06 |

FOREIGN PATENT DOCUMENTS

| | | | | |
|---|---|---|---|---|
| JP | 02249247 A | 10/1990 | | |
| JP | 05283479 A | 10/1993 | | |
| JP | 2001148403 A | 5/2001 | | |
| JP | 2003025085 A * | 1/2003 | ........ | G03F 7/70383 |
| JP | 2006140295 A | 6/2006 | | |
| JP | 2009094094 A * | 4/2009 | ............ | G02B 26/06 |

OTHER PUBLICATIONS

Office Action issued in counterpart Japanese patent application No. 2021-007890, dated Aug. 27, 2024.

* cited by examiner

*Primary Examiner* — Ibrahime A Abraham
*Assistant Examiner* — Hamzeh Hicham Amin
(74) *Attorney, Agent, or Firm* — GREER BURNS & CRAIN, LTD.

(57) ABSTRACT

An electrode welding method includes a laser irradiation apparatus preparation step of preparing a laser irradiation apparatus including a laser oscillator that emits a laser beam with a wavelength having absorbability with respect to a semiconductor chip and a spatial light modulator that adjusts the energy distribution of the laser beam emitted by the laser oscillator, an electrode positioning step of positioning, corresponding to electrodes of a wiring substrate, bump electrodes of a device, and an electrode welding step of irradiating the back surface of the semiconductor chip with the laser beam and welding the bump electrodes to the electrodes of the wiring substrate.

10 Claims, 6 Drawing Sheets

ELECTRODE WELDING METHOD AND ELECTRODE WELDING APPARATUS

BACKGROUND OF THE INVENTION

Field of the Invention

The present invention relates to an electrode welding method and an electrode welding apparatus by which a device in which plural bump electrodes are disposed on a front surface of a semiconductor chip is welded to electrodes of a wiring substrate.

Description of the Related Art

Devices such as integrated circuits (ICs) and large-scale integration (LSI) circuits in which bump electrodes are disposed on a front surface of a semiconductor chip of silicon or the like are used for pieces of electrical equipment such as portable phones and personal computers through welding of the bump electrodes to electrodes of a wiring substrate.

As methods for welding bump electrodes to electrodes of a wiring substrate, there have been proposed techniques in which irradiation with a laser beam is executed from the back surface side of a semiconductor chip and the bump electrodes are melted to be welded to the electrodes of the wiring substrate (for example, refer to Japanese Patent Laid-open No. Hei 02-249247, Japanese Patent Laid-open No. Hei 05-283479, and Japanese Patent Laid-open No. 2006-140295).

SUMMARY OF THE INVENTION

In the technique described in the above-mentioned Japanese Patent Laid-open No. Hei 02-249247, the whole of the back surface of the semiconductor chip is irradiated with a laser beam to heat and melt the bump electrodes, and the plural bump electrodes are simultaneously welded to connection terminals of a substrate. However, there is a problem that the plural bump electrodes are not uniformly heated and the welding becomes non-uniform.

Further, in the techniques described in the above-mentioned Japanese Patent Laid-open No. Hei 05-283479 and Japanese Patent Laid-open No. 2006-140295, irradiation with a laser beam is individually executed with each individual bump electrode targeted. However, a long time is taken, and it is difficult to accurately position the focal point position toward the bump electrode individually. Moreover, there is a problem that it takes a long time to weld all bump electrodes.

Thus, an object of the present invention is to provide an electrode welding method and an electrode welding apparatus that can surely weld bump electrodes to electrodes of a wiring substrate.

In accordance with an aspect of the present invention, there is provided an electrode welding method by which a device in which a plurality of bump electrodes are disposed on a front surface of a semiconductor chip is welded to electrodes of a wiring substrate. The electrode welding method includes a laser irradiation apparatus preparation step of preparing a laser irradiation apparatus including a laser oscillator that emits a laser beam with a wavelength having absorbability with respect to the semiconductor chip, a spatial light modulator that adjusts energy distribution of the laser beam emitted from the laser oscillator, and a control unit that adjusts the spatial light modulator in order to make a heating temperature of the plurality of bump electrodes uniform by the laser beam with which irradiation is executed, an electrode positioning step of positioning the bump electrodes corresponding to the electrodes of the wiring substrate, and an electrode welding step of irradiating a back surface of the semiconductor chip with the laser beam and welding the bump electrodes of the device to the electrodes of the wiring substrate, after executing the electrode positioning step.

In accordance with another aspect of the present invention, there is provided an electrode welding apparatus that welds a device in which a plurality of bump electrodes are disposed on a front surface of a semiconductor chip to electrodes of a wiring substrate. The electrode welding apparatus includes a laser irradiation apparatus including a laser oscillator that emits a laser beam with a wavelength having absorbability with respect to the semiconductor chip, a spatial light modulator that adjusts energy distribution of the laser beam emitted by the laser oscillator, and a control unit that adjusts the spatial light modulator in order to make a heating temperature of the plurality of bump electrodes uniform by the laser beam with which irradiation is executed, a table that supports the wiring substrate and supports the device in which the bump electrodes are positioned corresponding to the electrodes of the wiring substrate, and a processing movement mechanism that causes relative processing movement of the laser irradiation apparatus and the table.

Preferably, the laser irradiation apparatus further includes a beam condenser that condenses a laser beam resulting from the adjustment of the energy distribution by the spatial light modulator.

According to the electrode welding method of the present invention, by the spatial light modulator, the heated regions in the semiconductor chip that configures the device are selectively adjusted, and the bump electrodes are uniformly heated, so that the bump electrodes of the device can surely be welded to the electrodes of the wiring substrate. Thus, the problem that melting of the plural bump electrodes becomes non-uniform is eliminated.

According to the electrode welding apparatus of the present invention, by the spatial light modulator, the heated regions in the semiconductor chip that configures the device are selectively adjusted, and the bump electrodes are uniformly heated, so that the bump electrodes of the device can surely be welded to the electrodes of the wiring substrate. Thus, the problem that melting of the plural bump electrodes becomes non-uniform is eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An electrode welding method of an embodiment of the present invention and an electrode welding apparatus suitable for the electrode welding method will be described in detail below with reference to the accompanying drawings.

Figure 1:
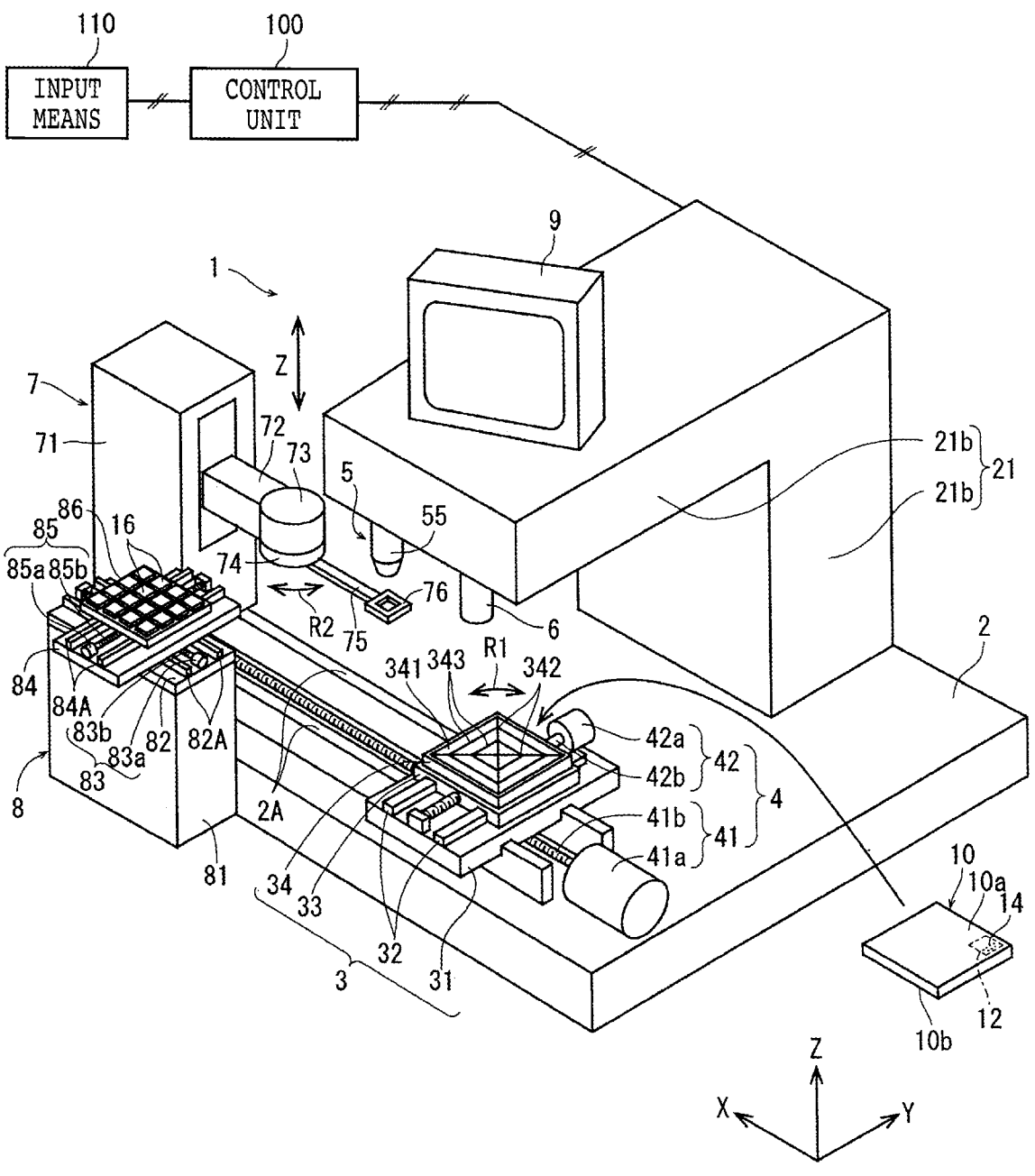
FIG. 1 is an overall perspective view of an electrode welding apparatus of an embodiment of the present invention.

In FIG. 1, an overall perspective view of an electrode welding apparatus 1 of the present embodiment is illustrated. The electrode welding apparatus 1 includes a base 2, a holding unit 3 including a table 34 that supports a wiring substrate 10 to be described later, a processing movement mechanism 4 that moves the holding unit 3 over the base 2, a laser irradiation apparatus 5 including a spatial light modulator (SLM) 54 to be described later, an imaging unit 6, a device conveying unit 7, a device supply unit 8, a display unit 9, a control unit 100 that adjusts the above-described spatial light modulator 54, and input means 110 with which predetermined information is input to the control unit 100.

The holding unit 3 includes an X-direction movable plate 31 disposed movably along guide rails 2A disposed in an X-direction indicated by an arrow X in the diagram, a Y-direction movable plate 33 disposed movably along guide rails 32 disposed in a Y-direction orthogonal to the X-direction over the X-direction movable plate 31, and the table 34 that has a rectangular shape and is set on the upper surface of the Y-direction movable plate 33 rotatably in a direction indicated by an arrow R1. Plural suction holes 342 and suction grooves 343 are formed on a holding surface 341 that configures the upper surface of the table 34, and the suction holes 342 are connected to suction means, of which diagrammatic representation is omitted, through the inside of the table 34. By actuating the suction means, a suction negative pressure is supplied to the suction holes 342 and the suction grooves 343, and the wiring substrate 10 illustrated in the diagram can be sucked and supported. The wiring substrate 10 is a substrate on which a device 16 illustrated in the diagram is mounted through electrode welding, and plural electrodes 14 are formed in a device installing region 12 (illustrated by a one-dot chain line) formed in a front surface 10a. The XY-plane defined by the above-described X-direction and Y-direction is substantially horizontal.

The processing movement mechanism 4 is means that causes relative processing movement of the laser irradiation apparatus 5 and the above-described table 34 and, more specifically, includes an X-direction movement mechanism 41 and a Y-direction movement mechanism 42. The X-direction movement mechanism 41 has a ball screw 41b that extends in the X-direction over the base 2 and a motor 41a coupled to a single end part of the ball screw 41b. A nut part (not illustrated) of the ball screw 41b is fixed to the lower surface of the X-direction movable plate 31. Further, the X-direction movement mechanism 41 converts rotational motion of the motor 41a to linear motion by the ball screw 41b and transmits the linear motion to the X-direction movable plate 31 through the nut part to cause the X-direction movable plate 31 to advance and retreat in the X-direction along the guide rails 2A on the base 2. The Y-direction movement mechanism 42 has a ball screw 42b that extends in the Y-direction over the X-direction movable plate 31 and a motor 42a coupled to a single end part of the ball screw 42b. A nut part (not illustrated) of the ball screw 42b is formed on the lower surface side of the Y-direction movable plate 33. Further, the Y-direction movement mechanism 42 converts rotational motion of the motor 42a to linear motion by the ball screw 42b and transmits the linear motion to the Y-direction movable plate 33 through the nut part to cause the Y-direction movable plate 33 to advance and retreat in the Y-direction along the guide rails 32 on the X-direction movable plate 31. A rotational drive mechanism (not illustrated) is further included in the processing movement mechanism 4. The rotational drive mechanism has a motor incorporated in the table 34 and rotates the table 34 in the direction indicated by the arrow R1 relative to the Y-direction movable plate 33.

On the back side of the holding unit 3 on the base 2, a frame body 21 including a perpendicular wall part 21a that extends upward from the upper surface of the base 2 and a horizontal wall part 21b that horizontally extends from the upper end of the perpendicular wall part 21a is disposed upright. An optical system of the laser irradiation apparatus 5 including the spatial light modulator 54 in the present embodiment is incorporated in the horizontal wall part 21b. As is understood from a block diagram that illustrates the outline of the laser irradiation apparatus 5 in FIG. 2, the laser irradiation apparatus 5 includes a laser oscillator 51 that emits a laser beam LB, an attenuator 52 that adjusts the output power of the laser beam LB emitted from the laser oscillator 51, a reflective mirror 53 that changes the optical path of the laser beam LB applied from the attenuator 52 as appropriate, and the spatial light modulator 54 that adjusts the energy distribution of the laser beam LB guided from the reflective mirror 53. The laser irradiation apparatus 5 further includes a beam condenser 55 including a condensing lens (not illustrated) that condenses a laser beam LB0 resulting from the adjustment of the energy distribution by the spatial light modulator 54, the control unit 100 that outputs an instruction signal of the adjustment of the energy distribution by the spatial light modulator 54, and the input means 110 with which information on the device 16 to be described later is input to the control unit 100.

As illustrated in FIG. 1, the beam condenser 55 is disposed on the lower surface of the tip part of the horizontal wall part 21b of the frame body 21. In the present embodiment, an example in which a reflective type (liquid crystal on silicon (LCOS)) is employed as the spatial light modulator 54 is described. However, the present invention is not limited thereto, and a spatial light modulator of a transmissive type (liquid crystal (LC)) may be employed with change in the optical path of the laser beam LB emitted from the laser oscillator 51. The beam condenser 55 is what is disposed in order to adjust the beam dimensions of the laser beam LB0 resulting from the adjustment of the energy distribution by the spatial light modulator 54 and can be omitted depending on the size of the workpiece. Further, the attenuator 52 and the reflective mirror 53 are also what are disposed as appropriate according to need and can be omitted as appropriate.

In the horizontal wall part 21b, a Z-direction movement mechanism (not illustrated) that moves the beam condenser 55 in a Z-direction (upward-downward direction) indicated by an arrow Z is disposed. The Z-direction movement mechanism configures a movement mechanism that causes the laser irradiation apparatus 5 and the table 34 to relatively advance and retreat in the Z-direction in the processing movement mechanism 4.

The imaging unit 6 is disposed on the lower surface of the tip of the horizontal wall part 21b and at a position at an interval from the beam condenser 55 of the laser irradiation apparatus 5 in the X-direction. In the imaging unit 6, for example, an optical system including illuminating means that executes irradiation with light including a visible beam and an imaging element (charge coupled device (CCD)) that executes imaging of an image obtained due to reflection of visible light is included. The display unit 9 that displays an image obtained by the imaging by the imaging unit 6 is mounted on the upper surface of the horizontal wall part 21b of the frame body 21.

The device conveying unit 7 includes a casing 71 that has a rectangular parallelepiped shape and that extends upward from the termination part of the guide rails 2A disposed along the X-direction on the base 2, a support arm 72 that extends in the X-direction and that is supported in such a manner as to be capable of rising and lowering by raising-lowering means that is housed in the casing 71 and of which diagrammatic representation is omitted, and a motor 73 disposed at the tip of the support arm 72. The device conveying unit 7 further includes a circular plate 74 rotated by the motor 73, a conveying arm 75 disposed on the circular plate 74, and a suction adhesion part 76 disposed at the tip of the conveying arm 75. The suction adhesion part 76 will be described in more detail with reference to FIGS. 3A and 3B.

Figure 3A:
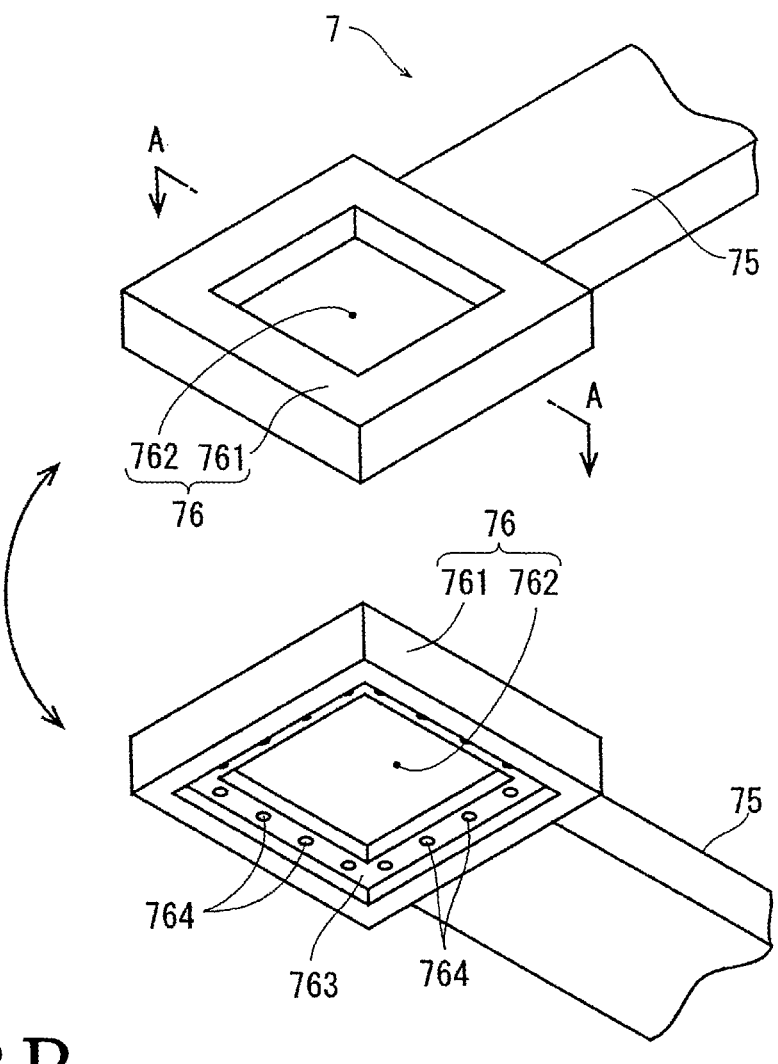
FIG. 3A is a perspective view illustrating a suction adhesion part of a conveying arm of a device conveying unit disposed in the electrode welding apparatus illustrated in FIG. 1 in an enlarged manner.
Figure 3B:
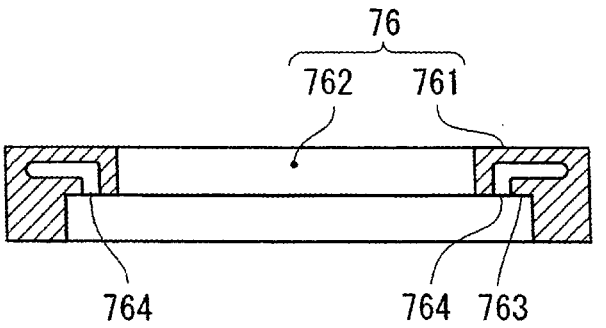
FIG. 3B is a sectional view along line A-A in FIG. 3A.

At the upper stage of FIG. 3A, a perspective view when the suction adhesion part 76 disposed at the tip of the conveying arm 75 is viewed from an obliquely upper side is illustrated. At the lower stage, a perspective view when the suction adhesion part 76 is viewed from an obliquely lower side is illustrated. As illustrated in the diagram, the suction adhesion part 76 includes a frame part 761 having a substantially rectangular shape in plan view and a rectangular through-hole 762 that is surrounded by the frame part 761 and vertically penetrates. As is understood from the diagram of the lower stage of FIG. 3A and FIG. 3B that illustrates a section along line A-A in the diagram of the upper stage of FIG. 3A, a step part 763 is formed on the lower surface side of the frame part 761 of the suction adhesion part 76, and plural suction holes 764 are disposed in the step part 763 at equal intervals. The suction holes 764 are connected to suction means, of which diagrammatic representation is omitted, through the conveying arm 75, the support arm 72, and so forth. By actuating the suction means, suction adhesion of the device 16 with dimensions that substantially correspond with the shape of the step part 763 in plan view can be caused.

Referring back to FIG. 1, the device supply unit 8 includes a support pedestal 81 formed into a box shape, a support base 82 disposed on the upper surface of the support pedestal 81, guide rails 82A disposed along the X-direction on the support base 82, and an X-direction moving plate 84 disposed movably in the X-direction along the guide rails 82A. The device supply unit 8 further includes guide rails 84A disposed along the Y-direction on the X-direction moving plate 84, a pallet 86 disposed movably in the Y-direction along the guide rails 84A, an X-direction movement mechanism 83 that moves the X-direction moving plate 84 along the X-direction, and a Y-direction movement mechanism 85 that moves the pallet 86 along the Y-direction.

The X-direction movement mechanism 83 of the above-described device supply unit 8 includes a motor 83a and a ball screw 83b rotated by the motor 83a, and the Y-direction movement mechanism 85 includes a motor 85a and a ball screw 85b rotated by the motor 85a. A configuration by which the X-direction moving plate 84 is caused to advance and retreat in the X-direction by the X-direction movement mechanism 83 and a configuration by which the pallet 86 is caused to advance and retreat in the Y-direction by the Y-direction movement mechanism 85 are substantially the same as that of the above-described processing movement mechanism 4 and therefore, detailed description thereof is omitted.

The pallet 86 is formed into a flat plate shape and houses the devices 16 in a surface in which plural regions are marked out in a lattice manner. As illustrated in a sectional view of FIG. 4B, the device 16 is an object in which plural bump electrodes 18 are disposed on a front surface 17a of a semiconductor chip 17. The pallet 86 in the embodiment illustrated in FIG. 1 houses 4×4=16 devices 16. The devices 16 are housed in the pallet 86 in such a manner that the front surface 17a on which the plural bump electrodes 18 are formed is oriented downward and a back surface 17b is oriented upward.

Although a wiring diagram is omitted, the above-described control unit 100 is also connected to, in addition to the spatial light modulator 54 of the laser irradiation apparatus 5, the X-direction movement mechanism 41, the Y-direction movement mechanism 42, and the rotational drive mechanism, of which diagrammatic representation is omitted, in the processing movement mechanism 4, the device conveying unit 7, and the X-direction movement mechanism 83 and the Y-direction movement mechanism 85 of the device supply unit 8. Further, position detecting means of which diagrammatic representation is omitted is disposed for each of the X-direction movement mechanism 41, the Y-direction movement mechanism 42, and the rotational drive mechanism, of which diagrammatic representation is omitted, in the processing movement mechanism 4, the device conveying unit 7, and the X-direction movement mechanism 83 and the Y-direction movement mechanism 85 of the device supply unit 8, and the configuration is made in such a manner that the table 34 and the pallet 86 can be accurately moved to a desired coordinate position in the XY-plane.

The electrode welding apparatus 1 of the present embodiment has the configuration that is substantially as described above. A description will be made below about an electrode welding method that is executed with use of the electrode welding apparatus 1 and by which the device 16 in which the plural bump electrodes 18 are disposed on the front surface 17a of the semiconductor chip 17 is welded to the electrodes 14 of the wiring substrate 10.

The device 16 welded to the wiring substrate 10 by the electrode welding method of the present embodiment is an object including the semiconductor chip 17 and the plural bump electrodes 18 disposed on the front surface 17a of the semiconductor chip 17 as described above, and the semiconductor chip 17 is formed of a silicon (Si) chip, for example. Further, in the front surface 10a of the wiring substrate 10, the device installing region 12 in which the electrodes 14 are formed corresponding to the plural bump electrodes 18 of the device 16 is formed.

Figure 2:
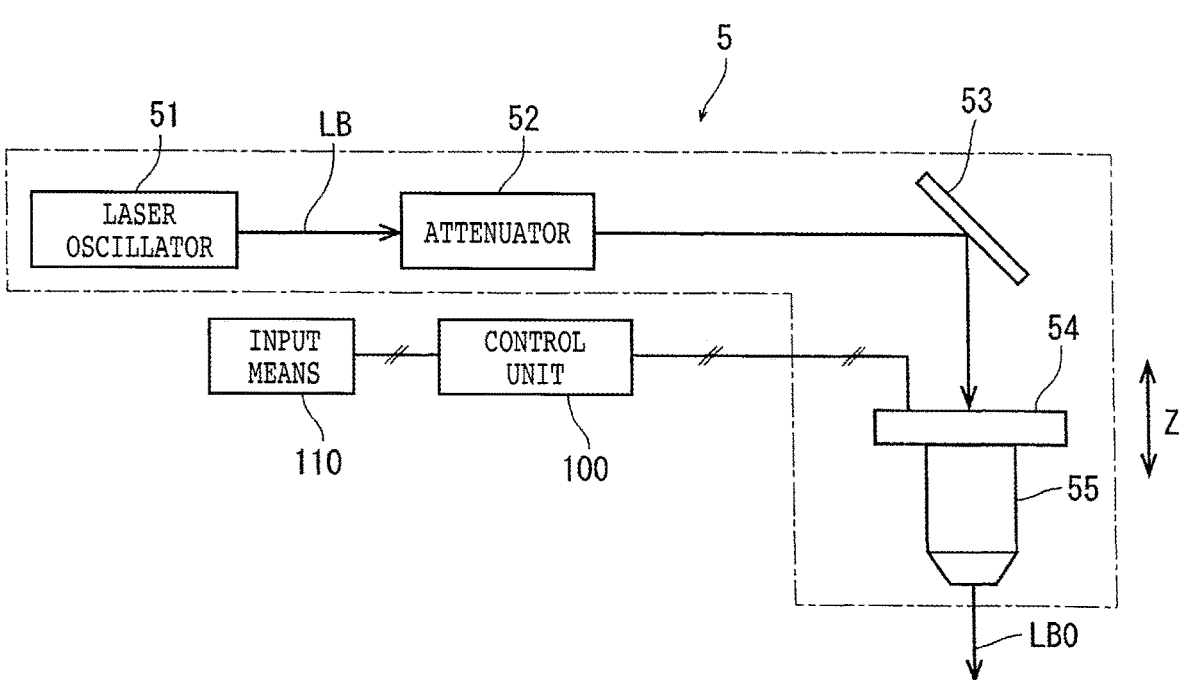
FIG. 2 is a block diagram illustrating an optical system of a laser irradiation apparatus disposed in the electrode welding apparatus illustrated in FIG. 1.

In the execution of the electrode welding method of the present embodiment, the laser irradiation apparatus 5 described based on FIG. 2 is prepared. Specifically, the laser oscillator 51 disposed in the laser irradiation apparatus 5 is what oscillates the laser beam LB with a wavelength having absorbability with respect to this silicon chip, and the laser irradiation apparatus 5 configured to include the spatial light modulator 54 that adjusts the energy distribution of the laser beam LB oscillated by the laser oscillator 51 and the control unit 100 that adjusts the spatial light modulator 54 in order to make the temperature of the plural bump electrodes 18 uniform by the laser beam LB with which irradiation is executed is prepared (laser irradiation apparatus preparation step).

After the above-described laser irradiation apparatus preparation step is executed, an electrode positioning step of positioning the bump electrodes 18 of the device 16 corresponding to the electrodes 14 of the wiring substrate 10 is executed. The electrode positioning step is executed through the following procedure, schematically.

First, as illustrated in FIG. 1, the table 34 is positioned to a carrying-out/in position with which the wiring substrate 10 is carried out and in. Subsequently, the wiring substrate 10 is placed on the table 34 in such a manner that the front surface 10a of the wiring substrate 10 is oriented upward and a back surface 10b is oriented downward, and the suction means of which diagrammatic representation is omitted is actuated to supply a suction negative pressure to the suction holes 342 and the suction grooves 343 and support the wiring substrate 10. Next, the processing movement mechanism 4 is actuated to move the table 34, and the wiring substrate 10 is positioned directly under the imaging unit 6. The device installing region 12 and the electrodes 14 on the wiring substrate 10 are imaged and the position thereof is detected, and information on the position is stored in a storing section (memory) of the control unit 100 (alignment). The electrodes 14 on the wiring substrate 10 correspond to the plural bump electrodes 18 formed in the device 16.

Figure 4A:
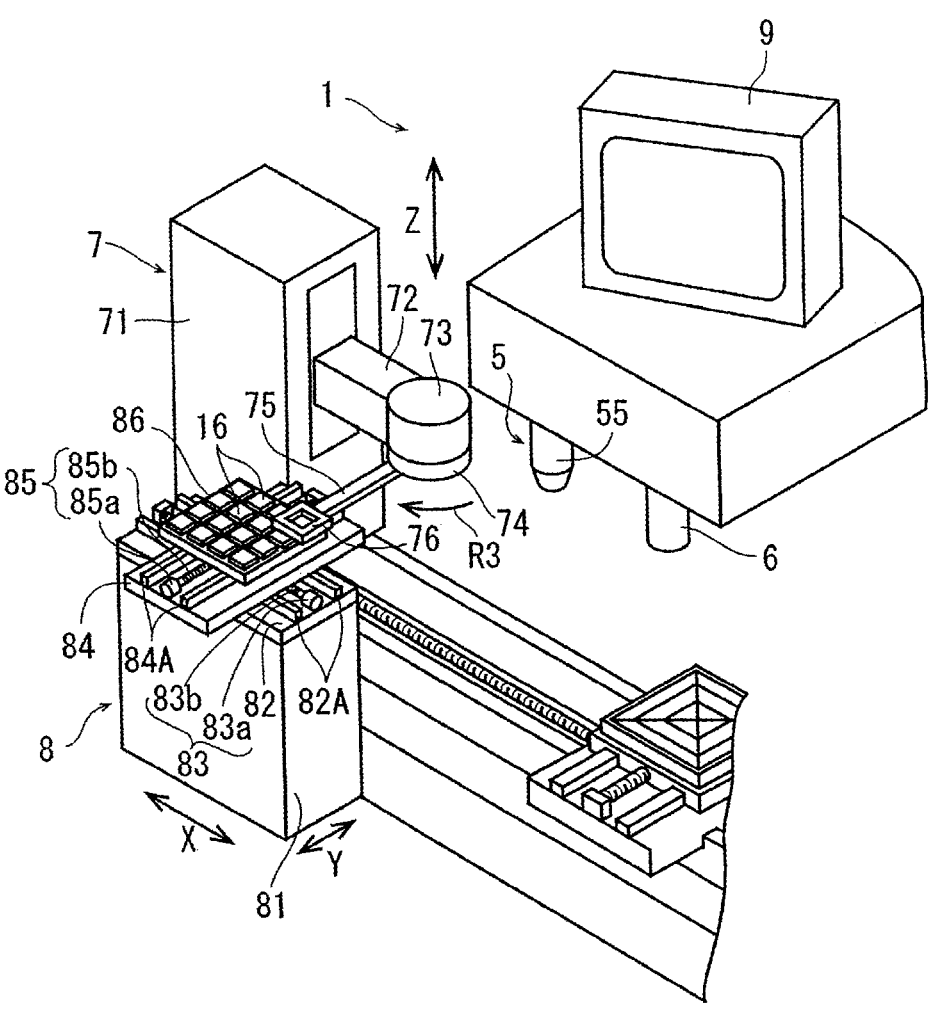
FIG. 4A is a perspective view illustrating the form of causing suction adhesion of a device by the suction adhesion part of the conveying arm in an electrode positioning step of the present embodiment.

Before, after, or simultaneously with the above-described alignment, the X-direction movement mechanism 83 and the Y-direction movement mechanism 85 of the device supply unit 8 are actuated, and the pallet 86 is positioned to a predetermined position. The predetermined position is a position with which the device 16 that is housed in the pallet 86 and is desired to be subjected to suction adhesion is positioned at a predetermined suction adhesion position when, as illustrated in FIG. 4A, the device conveying unit 7 is actuated to rotate the conveying arm 75 in a direction of an arrow R3 and the suction adhesion part 76 is positioned to the suction adhesion position. After the pallet 86 is positioned to the predetermined position as above, as illustrated in FIG. 4A, the device conveying unit 7 is actuated to rotate the conveying arm 75 in the direction indicated by the arrow R3, and the suction adhesion part 76 is positioned to the suction adhesion position. The device 16 to be conveyed next has been positioned directly under the suction adhesion part 76 positioned to the suction adhesion position.

Figure 4B:
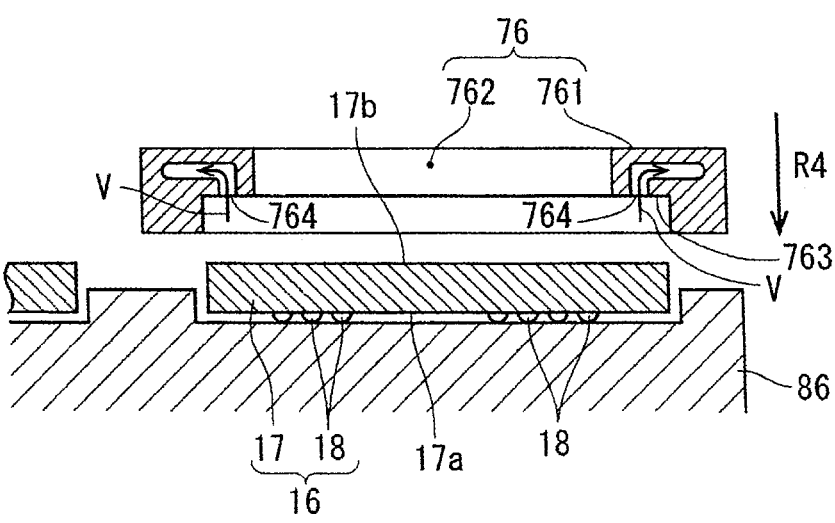
FIG. 4B is a sectional view illustrating one part in the execution form illustrated in FIG. 4A in an enlarged manner.

Subsequently, as illustrated in FIG. 4B, the raising-lowering means, of which diagrammatic representation is omitted, in the device conveying unit 7 is actuated to lower the suction adhesion part 76 in a direction indicated by an arrow R4. As illustrated in the diagram, the device 16 in which the plural bump electrodes 18 are formed on the front surface 17a of the semiconductor chip 17 is housed in the pallet 86 with the back surface 17b oriented upward, and the back surface 17b of the semiconductor chip 17 is housed in the step part 763 of the suction adhesion part 76. Next, the above-described suction means is actuated and a suction negative pressure V is supplied to the suction holes 764. Suction adhesion of the back surface 17b of the semiconductor chip 17 to the suction adhesion part 76 is thereby caused. As a result, suction adhesion of the device 16 by the suction adhesion part 76 is caused. Subsequently, the conveying arm 75 is raised and, as illustrated in FIG. 5, the conveying arm 75 is rotated in a direction indicated by an arrow R5 and the suction adhesion part 76 is positioned directly under the beam condenser 55.

Figure 5:
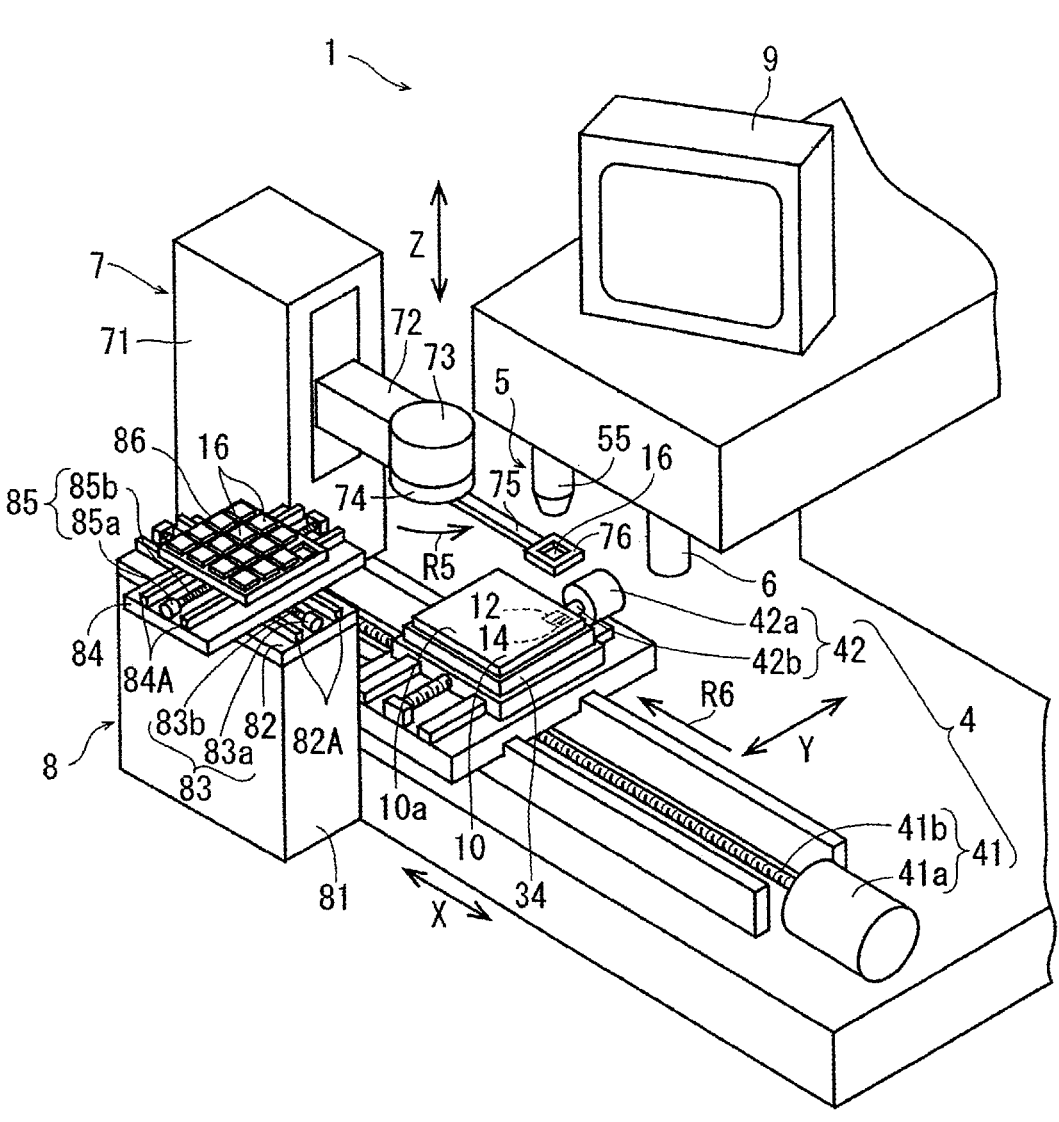
FIG. 5 is a perspective view illustrating the form of positioning the device directly under a beam condenser in the electrode positioning step.

In addition to the positioning of the suction adhesion part 76 directly under the beam condenser 55, the processing movement mechanism 4 is actuated to move the table 34 in a direction indicated by an arrow R6 in FIG. 5. More specifically, based on the position information of the device installing region 12 and the electrodes 14 of the wiring substrate 10 detected by the alignment, the electrodes 14 of the device installing region 12 of the wiring substrate 10 are positioned directly under the beam condenser 55 of the laser irradiation apparatus 5. As a result, in plan view, the device 16 and the device installing region 12 of the wiring substrate 10 are positioned directly under the beam condenser 55. In addition, the plural bump electrodes 18 formed on the front surface 17a of the semiconductor chip 17 of the device 16 are positioned corresponding to the electrodes 14 formed in the device installing region 12. Then, the conveying arm 75 of the device conveying unit 7 is lowered, and the bump electrodes 18 of the device 16 are brought into contact with the electrodes 14 formed in the device installing region 12 of the wiring substrate 10. Through the above, the electrode positioning step is completed.

Figure 6A:
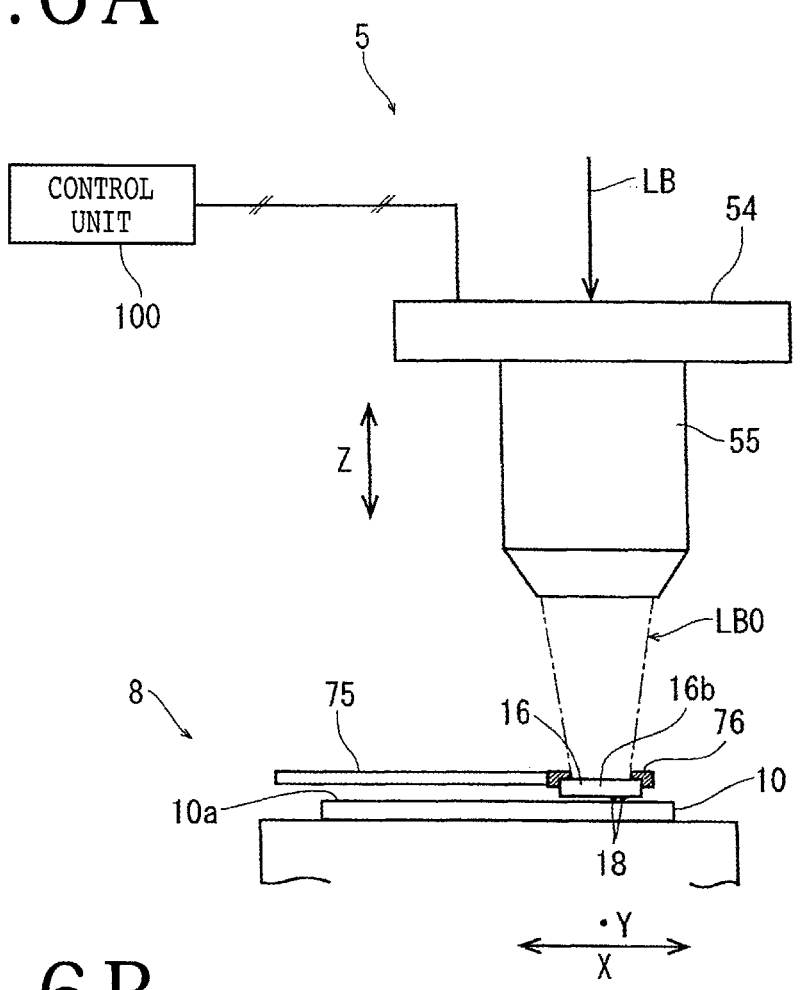
FIG. 6A is a side view illustrating the execution form of an electrode welding step.
Figure 6B:
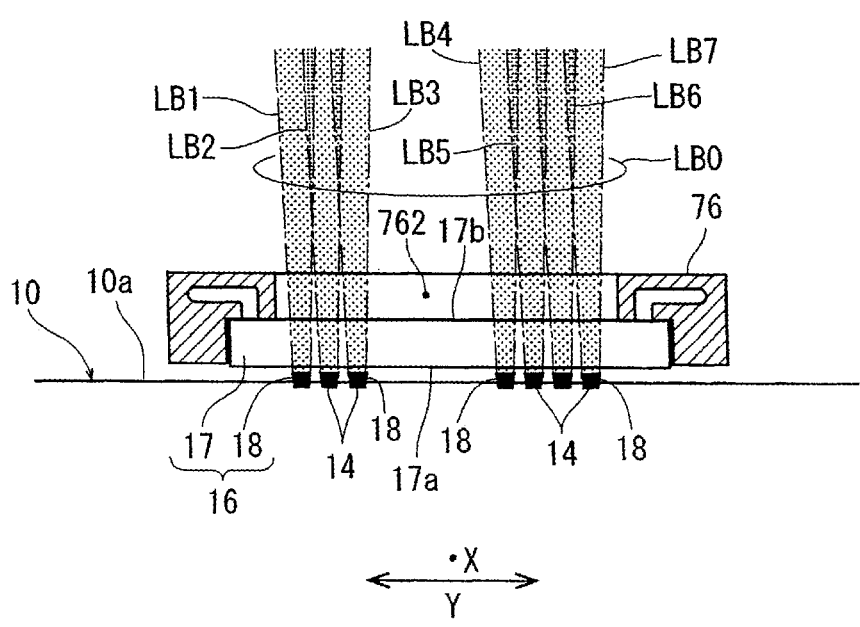
FIG. 6B is a conceptual diagram illustrating a section of one part in the execution form illustrated in FIG. 6A in an enlarged manner.

After the above-described electrode positioning step is executed, an electrode welding step of irradiating the back surface 17b of the semiconductor chip 17 with a laser beam and welding the bump electrodes 18 of the device 16 to the electrodes 14 of the wiring substrate 10 is executed. More specifically, first, device information is input to the control unit 100 through the input means 110 in advance. The input means 110 with which the device information is input is not necessarily an essential configuration, and the device information may be what is obtained through a communication network or the like. In the device information, information relating to dimensions of the device 16, information on the disposing position of the bump electrodes 18 formed on the front surface 17a of the semiconductor chip 17, and information relating to the material, thickness, and so forth of the semiconductor chip 17 are included. Based on these pieces of information, as illustrated in FIG. 6A, the above-described Z-direction movement mechanism of the processing movement mechanism 4 is actuated to adjust the position of the beam condenser 55 in the Z-direction, and the laser irradiation apparatus 5 is actuated and the instruction signal is sent from the control unit 100 to the spatial light modulator 54. In addition, the laser beam LB is emitted from the above-described laser oscillator 51 and is guided to the spatial light modulator 54, and the laser beam LB0 resulting from adjustment of the energy distribution of the laser beam LB is output from the spatial light modulator 54, so that the back surface 17b of the semiconductor chip 17 is irradiated with the laser beam LB0 as illustrated in FIG. 6B.

A continuous wave (CW) is employed as the laser beam LB emitted by the laser irradiation apparatus 5 of the present embodiment and is set to the following processing condition, for example.

Wavelength: 400 to 1100 nm

Average Output Power: 80 to 300 $W/cm^2$

As for the wavelength of the laser beam LB, it is preferable to set the wavelength to 900 to 1000 nm, with which reflection is suppressed at the front surface $17a$ of the semiconductor chip 17 and absorption into Si can be ensured, because the semiconductor chip 17 of the present embodiment is configured by Si.

According to the above-described embodiment, as is understood by FIG. 6B illustrated as a conceptual diagram, the laser beam LB0 with which the irradiation is executed from the back surface $17b$ of the semiconductor chip 17 selectively adjusts the heated regions in the semiconductor chip 17 as illustrated by LB1 to LB7 and makes the temperature of the bump electrodes 18 an uniform melting temperature to electrically connect the bump electrodes 18 and the electrodes 14 to each other, the electrodes 14 being formed in the device installing region 12 of the wiring substrate 10. The device 16 is thereby welded to the wiring substrate 10, and the table 34 becomes the state of supporting the device 16 in which the bump electrodes 18 are positioned corresponding to the electrodes 14 of the wiring substrate 10 as well as the wiring substrate 10. Through the above, the electrode welding step is completed.

After the above-described electrode welding step is completed, the suction negative pressure supplied to the suction adhesion part 76 is stopped, and the above-described raising-lowering means of the device conveying unit 7 is actuated to raise the suction adhesion part 76 together with the conveying arm 75. In addition, the processing movement mechanism 4 is actuated, and the table 34 is positioned to the carrying-out/in position at which the table 34 is positioned in FIG. 1. Subsequently, the suction means connected to the table 34 is stopped, and the wiring substrate 10 integrated with the device 16 is carried out. Next, the unprocessed wiring substrate 10 to which the device 16 has not been welded is placed on the table 34 and is sucked and supported. After the wiring substrate 10 is supported on the table 34, the above-described electrode positioning step and electrode welding step are executed. By repeating this, the remaining devices 16 housed in the pallet 86 can be welded to the wiring substrate 10.

According to the above-described embodiment, by the spatial light modulator 54, the heated regions in the semiconductor chip that configures the device 16 are selectively adjusted and the bump electrodes 18 are uniformly heated, so that the bump electrodes 18 of the device 16 can be favorably welded to the electrodes 14 of the wiring substrate 10. Due to this, the problem that melting of the plural bump electrodes 18 becomes non-uniform is eliminated.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An electrode welding method by which a device in which a plurality of bump electrodes are disposed on a front surface of a semiconductor chip is welded to electrodes of a wiring substrate, the electrode welding method comprising:

a laser irradiation apparatus preparation step of preparing a laser irradiation apparatus including a laser oscillator that emits a laser beam with a wavelength having absorbability with respect to the semiconductor chip, a spatial light modulator that adjusts energy distribution of the laser beam emitted from the laser oscillator, and a control unit that adjusts the spatial light modulator in order to make a heating temperature of the plurality of bump electrodes uniform by the laser beam with which irradiation is executed;

an electrode positioning step of positioning the bump electrodes corresponding to the electrodes of the wiring substrate, wherein the electrode positioning step includes using a device conveying unit, including a conveying arm, for conveying the device to a device installing region of the semiconductor chip where the bump electrodes of the device correspond to the electrodes of the wiring substrate; and an electrode welding step of irradiating a back surface of the semiconductor chip with the laser beam and welding the bump electrodes of the device to the electrodes of the wiring substrate, after executing the electrode positioning step, and wherein the conveying arm of the device conveying unit includes a suction adhesion part which further includes a frame part that surrounds a through-hole, wherein the frame part includes a plurality of suction holes therein, wherein, during the electrode positioning step, the conveying arm is moved with respect to a beam condenser of the laser irradiation apparatus, and further wherein, during the electrode welding step, the laser beam passes through the through-hole of the conveying arm.

2. An electrode welding apparatus that welds a device in which a plurality of bump electrodes are disposed on a front surface of a semiconductor chip to electrodes of a wiring substrate, the electrode welding apparatus comprising:

a laser irradiation apparatus including a laser oscillator that emits a laser beam with a wavelength having absorbability with respect to the semiconductor chip, a spatial light modulator that adjusts energy distribution of the laser beam emitted by the laser oscillator, a beam condenser that condenses a laser beam resulting from the adjustment of the energy distribution by the spatial light modulator, and a control unit that adjusts the spatial light modulator in order to make a heating temperature of the plurality of bump electrodes uniform by the laser beam with which irradiation is executed;

a device conveying unit, including a conveying arm, configured and arranged for conveying the device to a device installing region of the semiconductor chip where the bump electrodes of the device correspond to the electrodes of the wiring substrate, wherein the conveying arm of the device conveying unit is configured and arranged to be moved with respect to the beam condenser of the laser irradiation apparatus;

a table that supports the wiring substrate and supports the device in which the bump electrodes are positioned corresponding to the electrodes of the wiring substrate; and a processing movement mechanism that causes relative processing movement of the laser irradiation apparatus and the table, and wherein the conveying arm of the device conveying unit includes a suction adhesion part which further includes a frame part that surrounds a through-hole, wherein the frame part includes a plurality of suction holes therein and the through-hole is configured and arranged to allow the laser beam to pass therethrough.

3. The electrode welding apparatus according to claim 2, wherein the conveying arm of the device conveying unit is configured and arranged to be moved to a position between the beam condenser and the table that supports the wiring substrate.

4. The electrode welding method according to claim 1:
wherein one end of the conveying arm is connected to a motor and the opposite end of the conveying arm includes a suction adhesion part thereon, and
further wherein, during the electrode positioning step, the conveying arm is rotated by the motor to move the device from a first position above a device supply unit to a second position under the beam condenser of the laser irradiation apparatus.

5. The electrode welding apparatus according to claim 2:
wherein one end of the conveying arm is connected to a motor and the opposite end of the conveying arm includes a suction adhesion part thereon, and
further wherein the conveying arm configured and arranged to be rotated by the motor to move the device from a first position above a device supply unit to a second position under the beam condenser of the laser irradiation apparatus.

6. The electrode welding method according to claim 1, wherein the device conveying unit includes a support arm that is configured and arranged to be raised and lowered and a motor disposed on one end of the support arm, and further wherein the conveying arm is configured and arranged to be rotated by the motor, and
further wherein, during the electrode positioning step, the conveying arm is raised and lowered in association with the support arm and the conveying arm is also configured to be rotated by the motor.

7. The electrode welding apparatus according to claim 2, wherein the device conveying unit includes a support arm that is configured and arranged to be raised and lowered and a motor disposed on one end of the support arm, and further wherein the conveying arm is configured and arranged to be rotated by the motor.

8. The electrode welding method according to claim 1, wherein the electrode welding step is performed while the device is positioned within the suction adhesion part.

9. An electrode welding method by which a device in which a plurality of bump electrodes are disposed on a front surface of a semiconductor chip is welded to electrodes of a wiring substrate, the electrode welding method comprising:
a laser irradiation apparatus preparation step of preparing a laser irradiation apparatus including a laser oscillator that emits a laser beam with a wavelength having absorbability with respect to the semiconductor chip, a spatial light modulator that adjusts energy distribution of the laser beam emitted from the laser oscillator, and a control unit that adjusts the spatial light modulator in order to make a heating temperature of the plurality of bump electrodes uniform by the laser beam with which irradiation is executed;
an electrode positioning step of positioning the bump electrodes corresponding to the electrodes of the wiring substrate, wherein the electrode positioning step includes using a device conveying unit, including a conveying arm, for conveying the device to a device installing region of the semiconductor chip where the bump electrodes of the device correspond to the electrodes of the wiring substrate; and
an electrode welding step of irradiating a back surface of the semiconductor chip with the laser beam and welding the bump electrodes of the device to the electrodes of the wiring substrate, after executing the electrode positioning step, and
wherein the conveying arm of the device conveying unit includes a suction adhesion part which further includes a frame part that surrounds a through-hole, wherein the frame part includes a plurality of suction holes therein,
wherein, during the electrode positioning step, the conveying arm is moved with respect to the spatial light modulator of the laser irradiation apparatus,
wherein, during the electrode welding step, the laser beam passes through the through-hole of the conveying arm, and
wherein the electrode welding step is performed while the device is positioned within the suction adhesion part.

10. The electrode welding method according to claim 9:
wherein one end of the conveying arm is connected to a motor and the opposite end of the conveying arm includes a suction adhesion part thereon, and
further wherein, during the electrode positioning step, the conveying arm is rotated by the motor to move the device from a first position above a device supply unit to a second position under a beam condenser of the laser irradiation apparatus.

* * * * *